(12) United States Patent
Namioka

(10) Patent No.: US 8,178,895 B2
(45) Date of Patent: May 15, 2012

(54) SEMICONDUCTOR LIGHT-EMITING DEVICE AND METHOD

(75) Inventor: Kaori Namioka, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/840,118

(22) Filed: Jul. 20, 2010

(65) Prior Publication Data

US 2011/0101407 A1 May 5, 2011

Related U.S. Application Data

(62) Division of application No. 11/536,170, filed on Sep. 28, 2006, now Pat. No. 7,763,906.

(30) Foreign Application Priority Data

Sep. 29, 2005 (JP) ................................. 2005-284807

(51) Int. Cl.
*H01L 33/48* (2010.01)

(52) U.S. Cl. ..... 257/99; 257/98; 257/100; 257/E33.057; 438/22; 438/25; 438/26

(58) Field of Classification Search .................... 257/96, 257/97, 98, 99, 100, 33.057, 33.057 E; 438/22, 438/25, 26, 27, 29
See application file for complete search history.

(56) References Cited

U.S. PATENT DOCUMENTS

| | | | |
|---|---|---|---|
| 6,066,861 A | 5/2000 | Hohn et al. | |
| 6,245,259 B1 | 6/2001 | Hohn et al. | |
| 6,277,301 B1 | 8/2001 | Hohn et al. | |
| 6,521,915 B2 * | 2/2003 | Odaki et al. | 257/98 |
| 6,576,930 B2 | 6/2003 | Reeh et al. | |
| 6,592,780 B2 | 7/2003 | Hohn et al. | |
| 6,613,247 B1 | 9/2003 | Hohn et al. | |
| 6,669,866 B1 | 12/2003 | Kummer et al. | |
| 6,774,401 B2 | 8/2004 | Nakada et al. | |
| 6,803,607 B1 * | 10/2004 | Chan et al. | 257/98 |
| 6,809,342 B2 | 10/2004 | Harada | |
| 6,812,500 B2 | 11/2004 | Reeh et al. | |
| 7,208,772 B2 * | 4/2007 | Lee et al. | 257/99 |
| 2004/0036079 A1 * | 2/2004 | Nakada et al. | 257/81 |

FOREIGN PATENT DOCUMENTS

| | | |
|---|---|---|
| JP | 10190065 | 7/1998 |
| JP | 2001068741 | 3/2001 |
| JP | 2001127346 | 5/2001 |
| JP | 2001196639 | 7/2001 |
| JP | 2001210872 | 8/2001 |
| JP | 2001345483 | 12/2001 |
| JP | 2004056075 | 2/2004 |

* cited by examiner

*Primary Examiner* — Thinh T Nguyen

(74) *Attorney, Agent, or Firm* — Kenealy Vaidya LLP

(57) ABSTRACT

A semiconductor light-emitting device can include a submount on which a semiconductor light-emitting element is mounted. The device can have a high light utilization efficiency with high reliability and can achieve a reduction in manufacturing cost as well as a decrease in size. The submount can have a reverse trapezoidal cross section having an upper surface that is larger than a bottom surface of the semiconductor light-emitting element. An adhesive can be used to fix the submount to the base board such that, when the submount is observed from above the semiconductor light-emitting element, the adhesive is not seen from above. In this state, the semiconductor light-emitting element can be connected to the base board via a bonding wire.

25 Claims, 7 Drawing Sheets

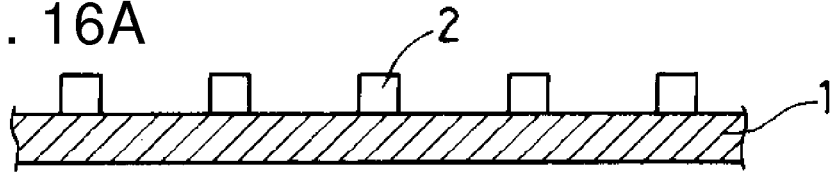
Fig. 16A
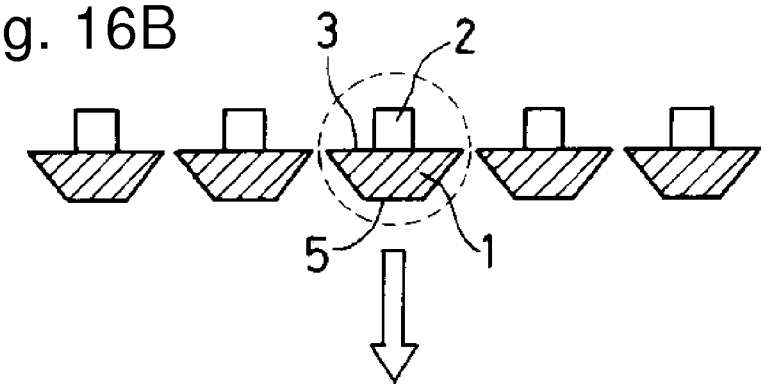
Fig. 16B
Fig. 16C
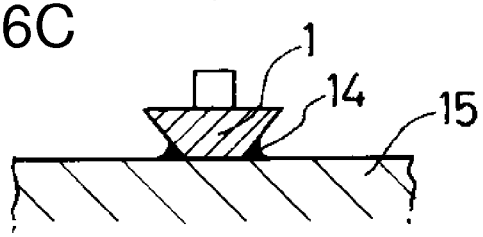
Fig. 16D
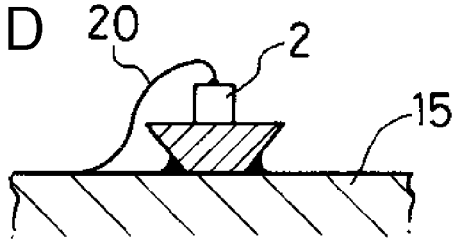
Fig. 16E
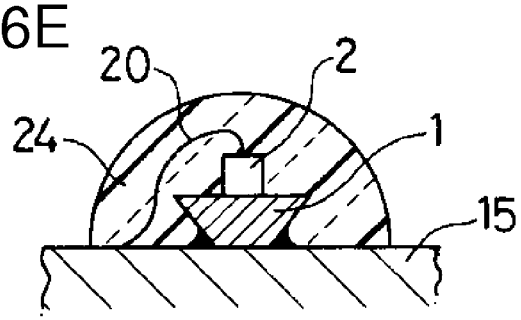

SEMICONDUCTOR LIGHT-EMITTING DEVICE AND METHOD

This application claims the priority benefit under 35 U.S.C. §120 and is a Divisional application of U.S. patent application Ser. No. 11/536,170 filed on Sep. 28, 2006 now U.S. Pat. No. 7763906, which is hereby incorporated in its entirety by reference. This application also claims the priority benefit under 35 U.S.C. §119 of Japanese Patent Application No. 2005-284807 filed on Sep. 29, 2005, which is hereby incorporated in its entirety by reference.

BACKGROUND

1. Field

The presently disclosed subject matter relates to semiconductor light-emitting devices, and in particular, to a semiconductor light-emitting device having a configuration in which a semiconductor light-emitting element is mounted on a submount.

2. Description of the Related Art

FIG. 1 shows the configuration of a conventional semiconductor light-emitting device. The conventional semiconductor light-emitting device is configured to include: a submount 51 having a recess 50; a lead frame 52 on which the submount 51 is fixed; a semiconductor laser element 54 placed on the bottom surface 53 of the recess 50; bonding pads 56 connected to a wiring pattern extending from the bottom surface 53 of the recess 50 via an inner peripheral surface 55 (the wiring pattern is not shown in the drawing, but is configured for electrically connecting the electrode of the semiconductor laser element 54 to the bonding pads 56), the bonding pads 56 being provided on the upper face of the side walls of the submount 51; bonding wires 57 for electrically connecting the bonding pads 56 to the lead frame 52; an encapsulating material 58 located in the recess 50 of the submount 51 to seal the semiconductor laser element 54; and a mold resin portion 59 for resin-sealing the submount 51 including the encapsulating material 58, the bonding wires 57, and the lead frame 52. (See, for example, the conventional art reference to Hideo Tamura et al.—Japanese Patent Laid-Open Publication No. 2001-68741.)

In the above-described semiconductor light-emitting device, the submount 51 is fixed on the lead frame 52 via an adhesive. In this instance, the adhesive may spread beyond the outer periphery 60 of the submount 51. For example, when the submount 51 having the recess is fixed on the lead frame 52 by means of an adhesive 70, as shown in FIG. 2, the adhesive 70 is in contact with the outer bottom surface 71 and the outer periphery 60 of the submount 51, and the lead frame 52. At the same time, the adhesive 70 may spread beyond the outer periphery 60 of the submount 51 over the lead frame 52 because it is pressed by the outer bottom surface 71 of the submount 51.

Under this situation, one end of the bonding wire 57 can be connected to the bonding pad 56 provided on the upper face of the side wall of the submount 51, but the other end thereof must be connected to the lead frame 52 at a position which is away from the outer periphery 60 of the submount 51 and is not covered with the adhesive 70 to avoid the adhesive 70 spreading over the lead frame 52.

In this case various problems arise, including the requirement that the bonding wire 57 be long to avoid the adhesive 70. This may increase the material cost, thereby also increasing the overall manufacturing cost. Depending on the amount of adhesive 70 that spreads outward beyond the outer periphery 60 of the submount 51 and the connecting position of the bonding wire 57, the semiconductor light-emitting device may inevitably become large in size. Furthermore, the wiring shape of the bonding wire 57 (loop shape) may change as shown by the dotted circle in FIG. 2 because the wiring length of the bonding wire 57 increases and the bonding wire 57 tends to receive the injection pressure of the mold resin 59 for sealing the bonding wire 57. In this case, the bonding wire 57 may be deformed to weaken the mechanical strength thereof against the resin stress. In other words, the resin stress received by the bonding wires 57 may vary depending on the difference between the thermal expansion coefficients of the bonding wire 57 and the mold resin 59 sealing the bonding wire 57. This may occur due to the high temperature environment during the mounting of the semiconductor light-emitting device on a mother board, or due to the temperature variation environment present due to the repeated turning on/off of the semiconductor light-emitting device mounted on the mother board. As a result of this, the bonding wire 57 may break or come off at its connecting portion or other like problems may occur, causing electrical failure of the connection.

In order to reduce the problems described above, it is conceivable to strengthen the resistance against the injection pressure of the mold resin by adopting a bonding wire with a larger diameter. However, this involves an increase in cost. Alternatively, it is conceivable that the amount of adhesive used for fixing the submount onto the lead frame can be decreased to narrow the range of spreading of the adhesive beyond the submount periphery. In this instance, the bonding wire can be shortened more than the previous case because the range of spreading of the adhesive may be narrowed and the bonding wire can be bonded nearer, in order to strengthen the resistance against the injection pressure of the mold resin. However, this may weaken the bonding strength of the submount to the lead frame.

Another conventional semiconductor light-emitting device is shown in FIG. 3 in which a semiconductor light-emitting element 80 is fixed to the plate-shaped submount 51 via an adhesive 70. In this instance, as in the previous conventional example, the adhesive 70 may spread beyond the side face 72 of the submount 51 outside the bottom surface 82 of the submount 51.

When power is supplied to the semiconductor light-emitting element 80, the light emitted from a side wall 81 side of the element 80 may be absorbed by the adhesive 70 as shown by the dotted small circle in FIG. 3. Therefore, the light utilization efficiency of the semiconductor light-emitting element 80 may deteriorate, thereby making the semiconductor light-emitting device emit light with a lower intensity.

SUMMARY

In view of the foregoing and other problems and characteristics of conventional devices, an aspect of the disclosed subject matter includes providing a semiconductor light-emitting device having a structure in which a semiconductor light-emitting element is mounted on a submount with high light utilization efficiency and reliability. The disclosed subject matter includes a small-sized semiconductor light-emitting device with possibly lower cost, greater manufacturability, and other possible characteristics and features.

One of the aspects of the presently disclosed subject matter is a semiconductor light-emitting device that can include: a submount having at least a pair of surfaces substantially parallel to each other; a semiconductor light-emitting element placed on one of the pair of the surfaces of the submount; a base board on which the submount is fixed with the other surface via a fixing member; and a seal resin for sealing at least the semiconductor light-emitting element and the submount. In the semiconductor light-emitting device as configured above, the other surface of the submount fixed on the base board can have a smaller area than a maximum cross section of the submount cut along a plane parallel to the pair of surfaces of the submount.

In the semiconductor light-emitting device, the fixing member may not exist beyond the submount when viewed from a direction above the semiconductor light-emitting element mounted. The submount may have a reversed trapezoidal cross section cut along a direction perpendicular to the base board.

In the semiconductor light-emitting device, the submount may have a first surface larger in area than a bottom surface of the placed semiconductor light-emitting element. Alternatively, the submount may have a first surface that has the same area as that of a bottom surface of the placed semiconductor light-emitting element.

The submount may have a stepped portion, and side walls of the submount other than the stepped portion may be perpendicular to the base board. In this case, the submount may have a first surface larger in area than a bottom surface of the placed semiconductor light-emitting element. Alternatively, the submount may have a first surface having the same area as that of a bottom surface of the placed semiconductor light-emitting element.

In the semiconductor light-emitting device, the submount may have a wedge-shaped cross section when cut along a direction perpendicular to the base board. Side walls of the submount may be inclined inward from a middle portion to the upper side and to the lower side.

The submount may have a wedge-shaped cross section when cut along a direction perpendicular to the base board, and a part of a side wall of the submount may be inclined inward and the other part of the side wall may be perpendicular to the base board.

Another aspect of the presently disclosed subject matter includes a semiconductor light-emitting device that can include: a submount having a recess and a lower surface, and an inner bottom surface located within the recess; a semiconductor light-emitting element placed on the inner surface within the recess of the submount; a base board on which the lower surface of the submount is fixed via a fixing member; a seal resin for sealing at least the semiconductor light-emitting element and the submount. In the above semiconductor light-emitting device, the lower surface of the submount that is fixed on the base board can have a smaller area than a maximum cross section of the submount cut along a plane parallel to the lower surface of the submount.

In the above semiconductor light-emitting device, the fixing member may not exist beyond a periphery of the submount when viewed from a direction above the semiconductor light-emitting element mounted.

An outer peripheral surface of the submount may include: the lower surface; a middle surface extending from the lower surface upward, the middle surface inclined outward; and a perpendicular surface to the lower face, the perpendicular surface extending from an upper end of the submount to the middle surface. The outer peripheral surface may have a stepped portion and a side wall of the submount from the stepped portion to the lower surface may be perpendicular to the base board. The recess may have a mortar shape.

As described above, the semiconductor light-emitting device can employ a fixing member which does not exist beyond a periphery of the submount area when viewed from a direction above the mounted semiconductor light-emitting element, due to the specific shape and features of the submount structure.

As a result of this, the bonding wire can be bonded to a position nearer to the submount than the case of typical conventional devices. Thus, the length of the bonding wire can be shortened. This can reduce both material costs as well as manufacturing costs. Furthermore, a size reduction of the semiconductor light-emitting device can be achieved. Also, the shortened bonding wire can have a stronger resistance against the injection pressure of the seal resin for sealing the bonding wire without varying the wiring shape (loop shape) of the bonding wire. This can avoid electrical failure due to the injection pressure, and can improve quality and reliability.

Furthermore, the light emitted from the side wall of the semiconductor light-emitting element can be reflected by the upper surface of the submount to be directed toward the light emitting surface of the semiconductor light-emitting device, thereby improving the light utilization efficiency of the light-emitting element. This can result in a high intensity semiconductor light-emitting device.

BRIEF DESCRIPTION OF THE DRAWINGS

These and other characteristics, features, and advantages of the disclosed subject matter will become clear from the following description with reference to the accompanying drawings, wherein:

FIGS. 16A to 16E show process steps for fabricating an embodiment of a semiconductor light-emitting device made in accordance with principles of the disclosed subject matter.

DETAILED DESCRIPTION OF EXEMPLARY EMBODIMENTS

Figure 1:
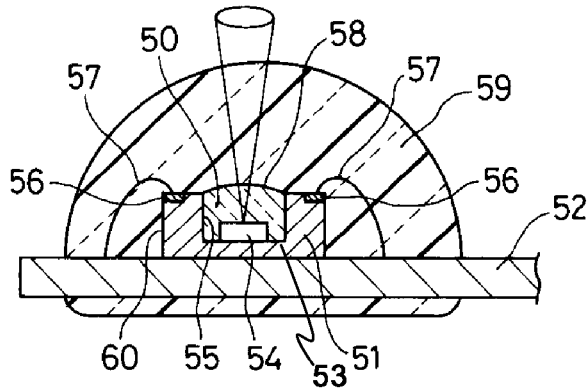
FIG. 1 is a cross-sectional view showing a conventional semiconductor light-emitting device.
Figure 2:
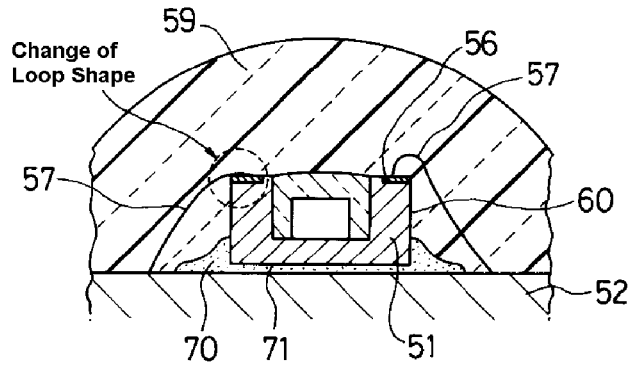
FIG. 2 is a cross-sectional view showing another conventional semiconductor light-emitting device.
Figure 3:
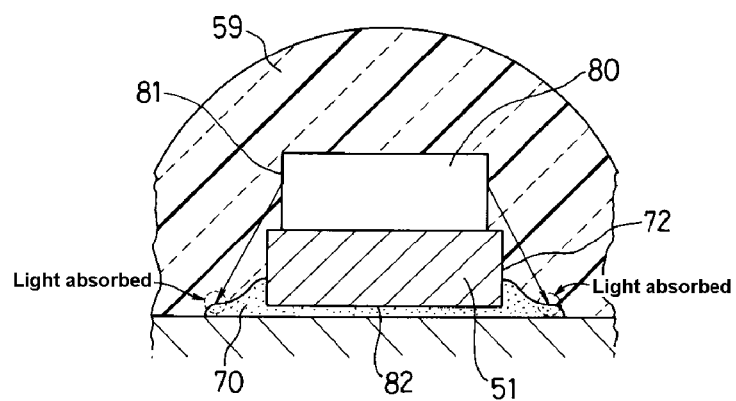
FIG. 3 is a cross-sectional view showing still another conventional semiconductor light-emitting device.

Hereinafter, exemplary embodiments of the disclosed subject matter will be described in detail with reference to FIGS. 4 to 16E (the same reference numerals refer to the same or similar parts). The exemplary embodiments described hereinafter are specific examples of the disclosed subject matter, and thus various technical features are applied thereto. However, the scope of the presently disclosed subject matter is not limited to the exemplary embodiments.

FIGS. 4 to 13 are each a cross-sectional view showing different exemplary embodiments of a submount for use in semiconductor light-emitting devices made in accordance with principles of the presently disclosed subject matter. The submounts shown in FIGS. 4 to 9 each have a substantial plate block shape having a pair of substantially parallel surfaces with a different side surface (also cross section). The submounts shown in FIGS. 10 to 13 each have a recess and a different outer periphery with a generally U-shaped cross-section.

A semiconductor light-emitting element can be placed on each of the submounts shown in FIGS. 4 to 13. Of these, in FIGS. 4 to 9 a semiconductor light-emitting element is mounted on a submount having a substantially plate-shaped block. In FIGS. 10 to 13, a semiconductor light-emitting element is mounted on a bottom surface within a recess of a submount having a generally U-shaped cross section.

A description will be given of the respective shapes of the submounts shown in FIGS. 4 to 13.

Figure 4:
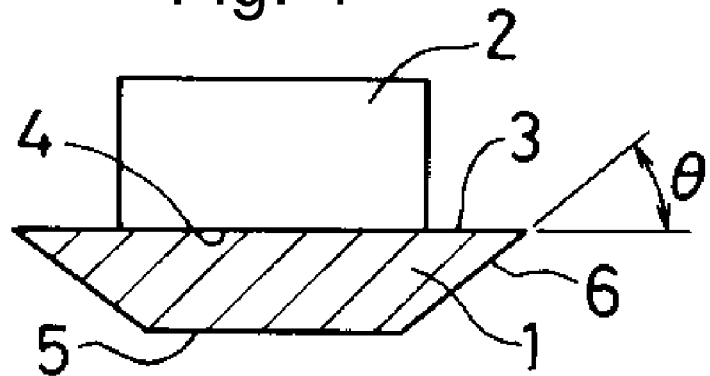
FIG. 4 is a cross-sectional view showing an embodiment of a submount with a semiconductor light-emitting element mounted thereon, both of which are components of an embodiment of a semiconductor light-emitting device made in accordance with principles of the presently disclosed subject matter.

The submount 1 shown in FIG. 4 has an upper surface 3 and a lower surface 5. The upper surface 3 can be used for mounting a semiconductor light-emitting element 2 thereon and can have a larger area than the area of the bottom surface 4 of the semiconductor light-emitting element 2 and the area of the lower surface 5 of the submount 1. The upper surface 3 can be substantially parallel to the lower surface 5. Therefore, the side surface 6 of the submount 1 is inclined inward from the upper surface 3 side to the lower surface 5 side. The submount 1 can have a reversed trapezoidal cross section when cut along the direction perpendicular to the base board. It may be desirable in certain applications that an angle θ formed by the upper surface 3 and the side surface 6 of the submount 1 be smaller than 90 degree ($\theta<90°$). The angle θ may also be larger than 45° and smaller than 60° ($45°<\theta<60°$) in view of bonding stability of the lower surface 5 of the submount 1.

Figure 5:
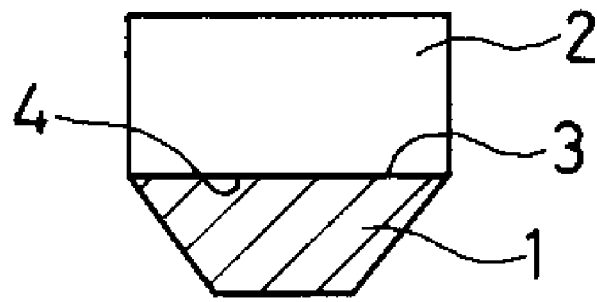
FIG. 5 is a cross-sectional view showing another embodiment of a submount structure for a semiconductor light-emitting device made in accordance with principles of the disclosed subject matter.

The submount 1 shown in FIG. 5 has a similar figure in cross section to that of the submount 1 shown in FIG. 4. The upper surface 3 can be used for mounting the semiconductor light-emitting element 2 and can have substantially the same area as that of the bottom surface 4 of the semiconductor light-emitting element 2.

Figure 6:
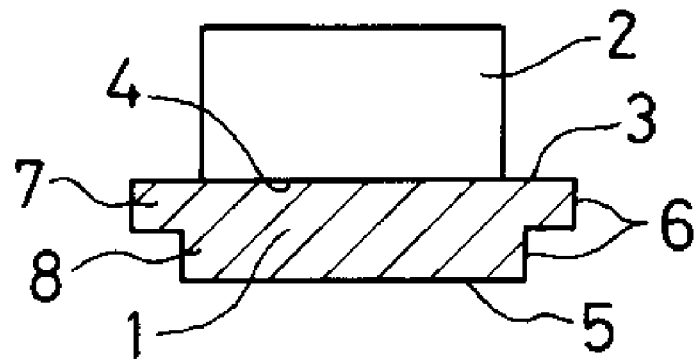
FIG. 6 is a cross-sectional view showing still another embodiment of a submount structure for a semiconductor light-emitting device made in accordance with principles of the disclosed subject matter.

The submount 1 shown in FIG. 6 has a two-level structure including an upper part 7 and a lower part 8. The upper part 7 can include an upper surface 3 on which a semiconductor light-emitting element 2 is mounted. The lower part 8 has a lower surface 5. The upper surface 3 can have a larger area than that of the bottom surface 4 of the semiconductor light-emitting element 2. A step portion can be provided between the upper part 7 and the lower part 8 and can be larger than the lower surface 5. Side surfaces 6 of the upper part 7 and the lower part 8 can be made substantially perpendicular to the upper surface 3 and the lower surface 5.

Figure 7:
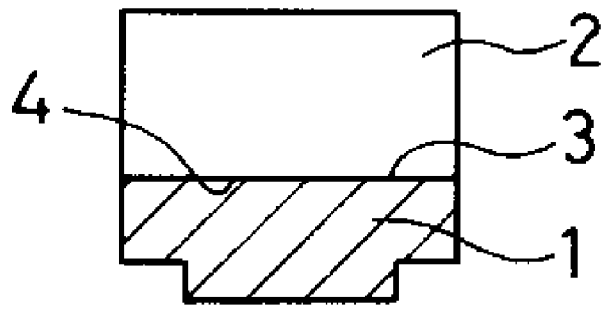
FIG. 7 is a cross-sectional view showing still another embodiment of a submount structure for a semiconductor light-emitting device made in accordance with principles of the disclosed subject matter.

The submount 1 shown in FIG. 7 has a similar figure in cross section to that of the submount 1 shown in FIG. 6. The upper surface 3 thereof for mounting the semiconductor light-emitting element 2 can have substantially the same area as that of the bottom surface 4 of the semiconductor light-emitting element 2.

Figure 8:
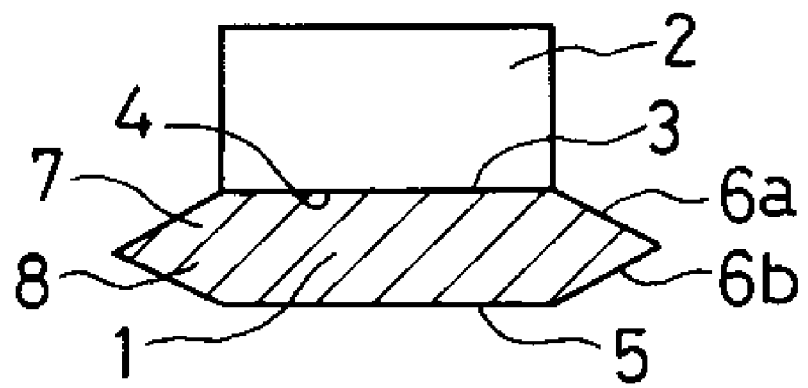
FIG. 8 is a cross-sectional view showing still another embodiment of a submount structure for a semiconductor light-emitting device made in accordance with principles of the disclosed subject matter.

The submount 1 shown in FIG. 8 has a two-level structure including an upper part 7 and a lower part 8. The upper part 7 has an upper surface 3 on which a semiconductor light-emitting element 2 can be mounted. The lower part 8 has a lower surface 5. The side surface 6a of the upper part 7 can be inclined outward from the upper surface 3 side to the lower part side. On the other hand, the side surface 6b of the lower part 8 can be inclined outward from the lower surface 5 side to the upper part side. Namely, the entire cross section of the submount 1 can have a wedge shape. The side surfaces 6a and 6b can contact with each other at the boarder of the upper and lower portions 7 and 8. In this exemplary embodiment, the upper surface 3 of the submount 1 has an area that is substantially the same as that of the bottom surface 4 of the semiconductor light-emitting element 2 to be mounted thereon.

Figure 9:
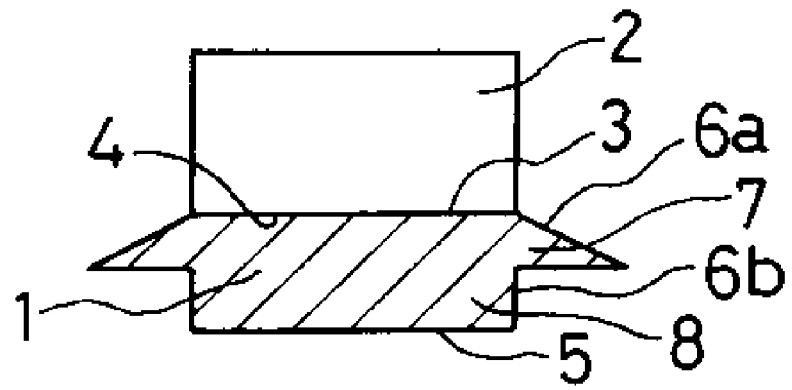
FIG. 9 is a cross-sectional view showing still another embodiment of a submount structure for a semiconductor light-emitting device made in accordance with principles of the disclosed subject matter.

The submount 1 shown in FIG. 9 has a two-level structure including an upper part 7 and a lower part 8. The upper part 7 has an upper surface 3 on which a semiconductor light-emitting element 2 can be mounted. The lower part 8 has a lower surface 5. The side surface 6a of the upper portion 7 can be inclined outward from the upper surface 3 side to the lower part side, thereby providing a wedge-shaped cross section for the upper portion. On the other hand, the side surface 6b of the lower part 8 can be substantially perpendicular to the lower surface 5. The upper surface 3 can have an area that is substantially the same as that of the bottom surface 4 of the semiconductor light-emitting element 2. The upper part 7 can include a larger area at the boarder area between the upper and lower parts 7 and 8 than lower surface 5 of the lower part 8.

Figure 10:
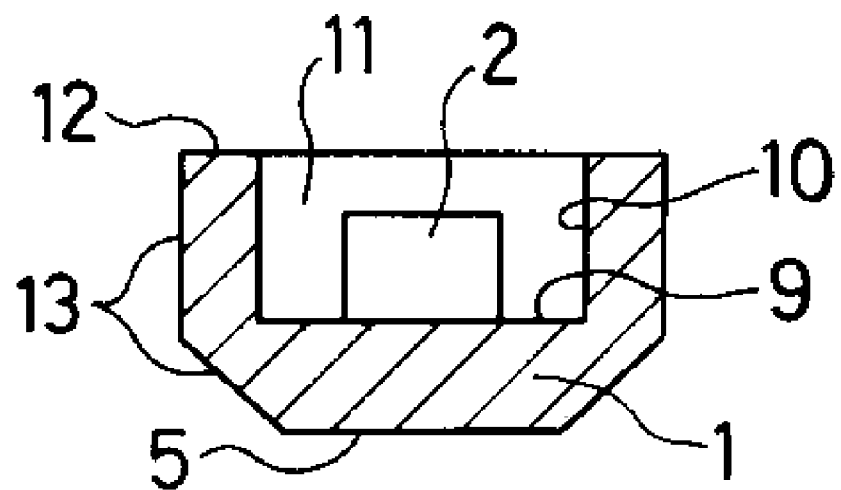
FIG. 10 is a cross-sectional view showing still another embodiment of a submount structure for a semiconductor light-emitting device made in accordance with principles of the disclosed subject matter.

The submount 1 shown in FIG. 10 has a recess 11, which has a substantially flat inner bottom surface 9 and an inner peripheral surface 10 substantially perpendicular to the inner bottom surface 9. On the inner bottom surface 9, a semiconductor light-emitting element 2 can be placed. In addition, the submount 1 can have a lower surface 5 that is substantially parallel to the inner bottom surface 9 of the recess 11. The submount 1 can also include an outer peripheral surface 13 that has a surface substantially perpendicular to the lower surface 5 and which extends from the upper edge 12 of the submount 1 toward the lower side. The outer peripheral surface 13 can also include an inclined surface that extends between the lower surface 5 and the outer perpendicular surface and is outwardly inclined from the lower surface 5 toward the outer perpendicular surface.

Figure 11:
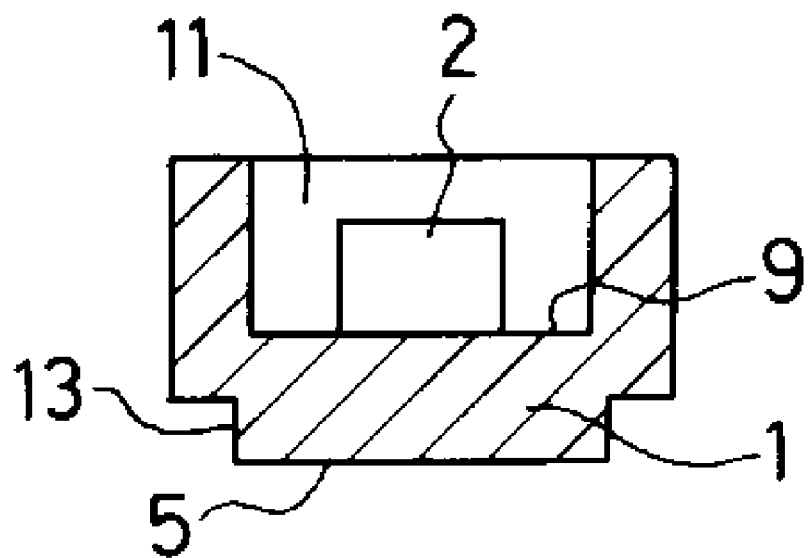
FIG. 11 is a cross-sectional view showing still another embodiment of a submount structure for a semiconductor light-emitting device made in accordance with principles of the disclosed subject matter.

The submount 1 shown in FIG. 11 is approximately the same shape as that of the submount 1 shown in FIG. 10, except for the surface connecting the outer perpendicular surface and the lower surface 5. The connecting surface area includes a perpendicular surface and a parallel surface as shown in the drawing.

Figure 12:
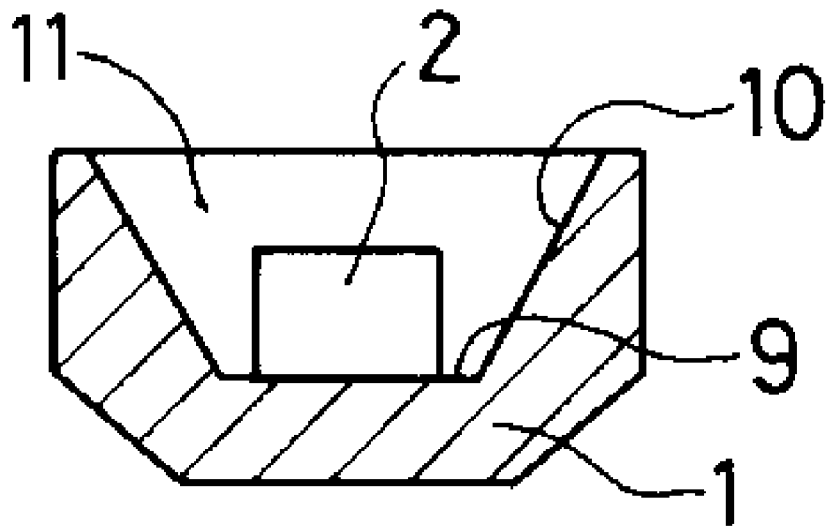
FIG. 12 is a cross-sectional view showing still another embodiment of a submount structure for a semiconductor light-emitting device made in accordance with principles of the disclosed subject matter.

The submount 1 shown in FIG. 12 has substantially the same shape as that of the submount 1 shown in FIG. 10, except for the inner peripheral surface 10 having a mortar shape (inclined inwardly from the upper edge).

Figure 13:
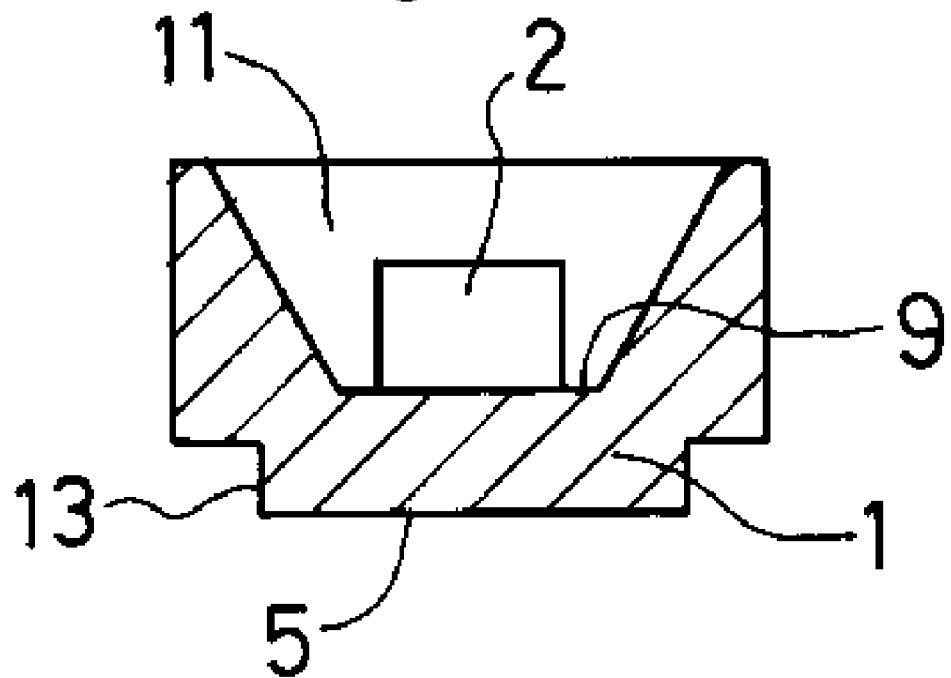
FIG. 13 is a cross-sectional view showing still another embodiment of a submount structure for a semiconductor light-emitting device made in accordance with principles of the disclosed subject matter.

The submount 1 shown in FIG. 13 is approximately the same shape as that of the submount 1 shown in FIG. 12, except for the surface connecting the outer peripheral perpendicular surface and the lower surface 5. The connecting surface area includes a perpendicular surface and a parallel surface as shown in the drawing.

It should be appreciated that the material of the submount can be configured to meet the performance requirements, including high processability, high durability, and/or good heat dissipation properties for use when turning on the mounted element that is to be lit. Examples of the material include, but are not limited to, insulating materials such as glass epoxy resins and ceramics, metal materials such as Au, Cu, Al, and alloys of these metal materials, semiconductor materials such as Si and Si derivatives, etc. Taking heat dissipation property into consideration, metal materials can be used in certain applications to provide good heat dissipation. In order to improve the heat dissipation property, the thickness of the submount may be reduced.

The submount 1 on which the semiconductor light-emitting element 2 is mounted can be connected onto a base board, thereby completing or taking a step to complete the fabrication of the semiconductor light-emitting device. Hereinafter, the connecting structure for fixing the submount to the base board will be described with reference to FIGS. 14 and 15, in which two types of the submounts 1 are exemplified among those shown in FIGS. 4 to 13.

Figure 14:
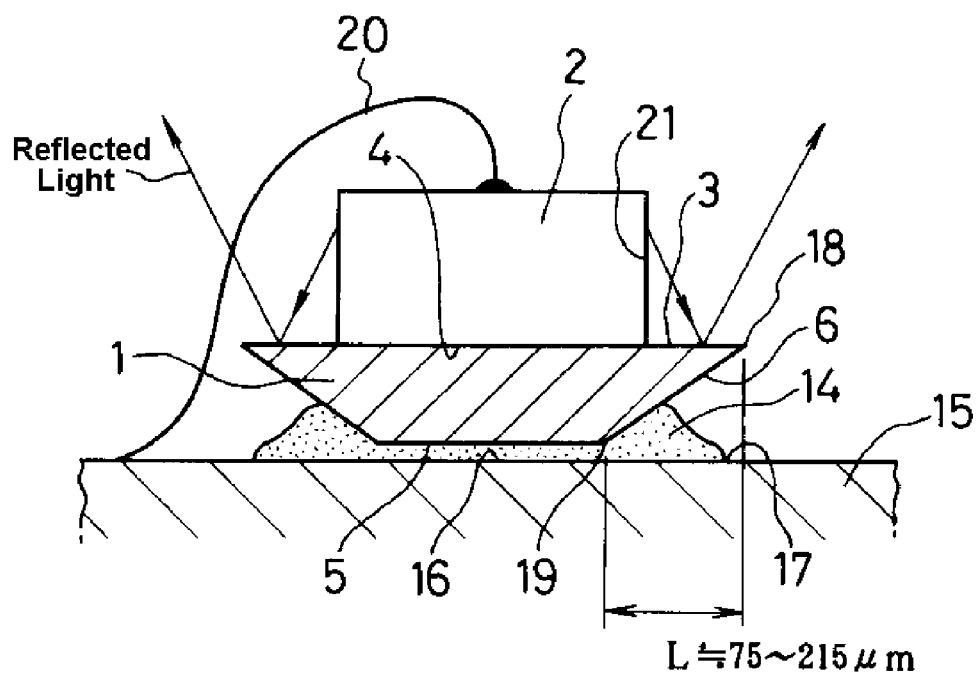
FIG. 14 is a cross-sectional view showing an embodiment of a mounting state for a submount with a semiconductor light-emitting element in accordance with principles of the disclosed subject matter.

FIG. 14 shows a state wherein the submount 1 shown in FIG. 4 is connected to the base board 15 via an adhesive 14 (e.g., Ag paint). The adhesive 14 can be in contact with the lower surface 5 and the side surface 6 of the submount 1, and the surface 16 of the base board 15. The adhesive 14 that is located beyond the side face 6 of the submount 1 spreads over the surface 16 of the base board 15. In this instance, the upper surface 3 of the submount 1 to which the semiconductor light-emitting element 2 is mounted can be larger than the bottom surface 4 of the semiconductor light-emitting element 2 and the lower surface 5 of the submount 1. Therefore, the side surface 6 can be inwardly inclined from the upper surface 3 side toward the lower surface 5. As a result of this, the submount 1 can have a reverse trapezoid shape in cross section.

In this case, the adhesive 14 may spread over the surface 16 of the base board 15 from the side surface 6 of the submount 1 outward. The adhesive 14 may also be interposed between the inclined side surface 6 of the submount 1 and the surface 16 of the base board 15. In addition to the above-described configuration, the end 17 of the adhesive 14 that spreads outward from the side surface 6 of the submount 1 over the surface 16 of the base board 15 can terminate within the area corresponding to the edge 18 of the upper surface 3 of the submount 1 (the area corresponding to the upper surface 3 of the submount 1).

When the connecting state of the submount 1 onto the base board 15 is observed from above the semiconductor light-emitting element 2, the adhesive 14 is not seen from above because the adhesive 14 is hidden by the submount 1.

In order to terminate the flow of the adhesive 14 within the edge 18 of the upper surface 3 of the submount 1, the distance L as shown in FIG. 14 can be set within a range of approximately 75 to 215 μm wherein the distance L is defined as a distance between the edge 19 of the lower surface 5 and the edge 18 of the upper surface 3 when projected onto a same plane.

In accordance with the above-described configuration, the bonding wire 20 can be bonded to a position nearer to the submount 1. This can shorten the wiring length of the bonding wire 20. Therefore, the material cost as well as the manufacturing cost can be reduced or maintained. Furthermore, a reduction in size of the semiconductor light-emitting device may be achieved. Also, the shortened bonding wire 20 can have a stronger resistance against the injection pressure of the seal resin for sealing the bonding wire 20 without varying the wiring shape (loop shape) of the bonding wire 20. This avoids possible electrical failure due to the injection pressure and ensures the high quality and reliability of the lighting device.

Furthermore, the light emitted from the side surface 21 of the semiconductor light-emitting element 2 can be reflected by the upper surface 3 of the submount 1 such that it is directed toward a light emitting surface of the semiconductor light-emitting device, thereby improving the light utilization efficiency of the light-emitting element 2. The above described configuration can achieve a high intensity semiconductor light-emitting device.

Figure 15:
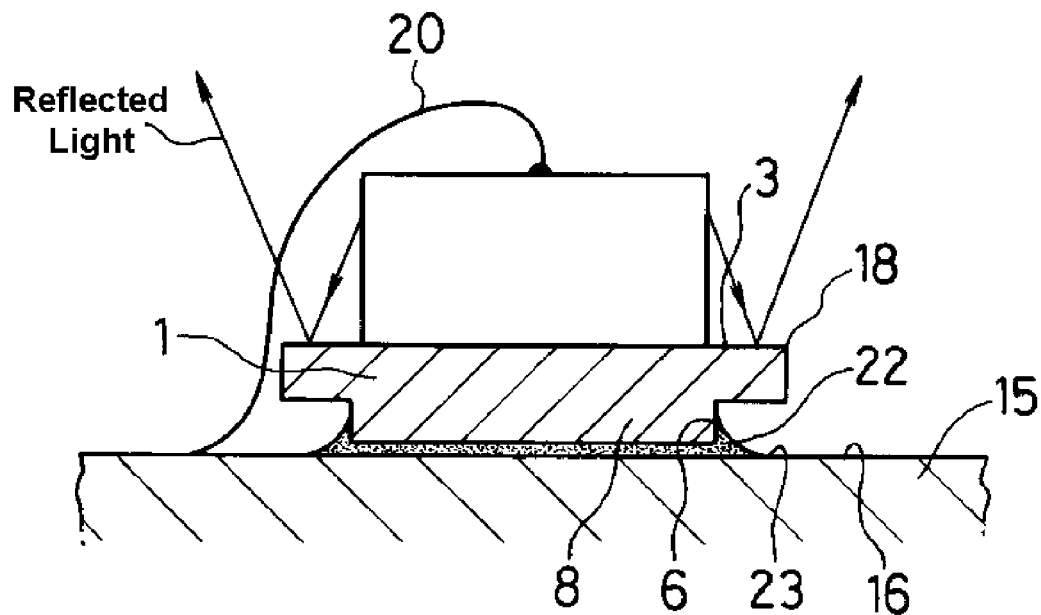
FIG. 15 is a cross-sectional view showing another embodiment of a mounting state for another submount with a semiconductor light-emitting element in accordance with principles of the disclosed subject matter.

FIG. 15 shows a state wherein the submount 1 shown in FIG. 6 is connected to the base board 15 via a soldering material 22. In this case, the soldering material 22 rises along the side surface 6 of the submount 1 at the lower part 8, and also spreads over the surface 16 of the base board 15, to ensure the bonding of the submount 1 onto the base board 15. In order to facilitate rising of the soldering material 22, the side surface 6 of the lower part 8 of the submount 1 can be substantially perpendicular to the lower surface 5 of the submount 1 (or substantially perpendicular to the surface 16 of the base board 15).

In this case, the end 23 of the soldering material 22 that spreads outward from the side surface 6 of the submount 1 over the surface 16 of the base board 15 can terminate within the area corresponding to the edge 18 of the upper surface 3 of the submount 1.

When the connecting state of the submount 1 onto the base board 15 is observed from above the semiconductor light-emitting element 2, the soldering material 22 may not be seen from above because the soldering material 22 is hidden by the submount 1.

Therefore, as in the exemplary embodiment shown in FIG. 14, the bonding wire 20 can be bonded to a position nearer to the submount 1. This can shorten the wiring length of the bonding wire 20. Therefore, the material cost as well as the manufacturing cost can be maintained or reduced. Furthermore, a reduction in size of the semiconductor light-emitting device can be achieved. Also, the shortened bonding wire 20 can have a stronger resistance against the injection pressure of the seal resin for sealing the bonding wire 20 without varying the wiring shape (loop shape) of the bonding wire 20. Thus, electrical failure due to the injection pressure can be avoided, and high quality and reliability in the lighting device can be achieved.

It should be appreciated that a metal film with a high reflectivity can be formed on the upper surface of the submount where the semiconductor light-emitting element is mounted and bonded. The metal film can be formed by CVD technique, sputtering technique, or other techniques. This configuration can improve the light utilization efficiency of the semiconductor light-emitting element, thereby increasing the intensity of light emitted from the semiconductor light-emitting device. Furthermore, meshed grooves may be formed on the upper surface of the submount in order to increase the bonding strength between the submount and the semiconductor light-emitting element. A circuit pattern that is to be connected to electrodes of the semiconductor light-emitting element may be formed on the upper surface of the submount in order to supply power to the semiconductor light-emitting element from an exterior power source.

Examples of the material for fixing a submount to a base board include, but are not limited to, Ag paste, silicone resin-based adhesives, epoxy resin-based adhesives, soldering materials, and the like. If silicone resin-based or epoxy resin-based adhesives are employed, fillers may be contained therein in order to increase the heat conductivity. Examples of the base board used herein include, but are not limited to, insulating materials with wiring such as glass epoxy substrates, ceramic substrates such as aluminum nitride substrates, metal substrates with wiring (metal including Al, Cu, and the like), etc.

A method for manufacturing a semiconductor light-emitting device employing a submount in accordance with the disclosed subject matter will be described below, with reference to FIGS. 16A to 16E.

As shown in FIG. 16A, a plurality of semiconductor light-emitting elements 2 are mounted onto an unprocessed submount material at regular intervals.

As shown in FIG. 16B, the submount material can be cut into submounts 1 each having the semiconductor light-emitting element 2 mounted thereon such that the side surface from the upper surface 3 side to the lower surface 5 side is inwardly inclined.

As shown in FIG. 16C, the separated submount 1 with the semiconductor light-emitting element 2 can be fixed onto a base board 15 via an adhesive 14.

As shown in FIG. 16D, bonding wires 20 can be used to electrically connect the semiconductor light-emitting element 2 and a circuit pattern associated with the base board 15 (the circuit pattern thereon is not shown).

As shown in FIG. 16E, the semiconductor light-emitting element 2, the submount 1, the bonding wires 20, and the base board 15 can be sealed with a sealing resin 24 (e.g., a transparent resin with or without a wavelength conversion material) to complete the semiconductor light-emitting device.

While there has been described what are at present considered to be exemplary embodiments of the invention, it will be understood that various modifications may be made thereto, and it is intended that the appended claims cover such modifications as fall within the true spirit and scope of the invention. All conventional art references described above are herein incorporated in their entirety by reference.

What is claimed is:

1. A semiconductor light-emitting device comprising:
    a submount having a first surface, a second surface that is substantially parallel to the first surface, and a third surface connecting the first surface and the second surface;
    a semiconductor light-emitting element located adjacent the first surface of the submount;
    a base board on which the second surface of the submount is fixed via a fixing member; and
    a transparent seal resin configured to seal at least the semiconductor light-emitting element and the submount so that the transparent seal resin also covers at least a part of the third surface and a part of the base board, wherein
    the second surface of the submount that is fixed on the base board has a smaller area than a maximum cross section area of the submount cut along a plane substantially parallel to both the first surface and the second surface of the submount,
    the fixing member is disposed between the base board and the second surface of the submount as well as on part of the third surface and is covered by the transparent seal resin.

2. The semiconductor light-emitting device according to claim 1, wherein the fixing member does not exist beyond the submount when viewed from a direction above the semiconductor light-emitting element when mounted to the submount.

3. The semiconductor light-emitting device according to claim 1, wherein the submount has a reverse trapezoidal cross section when cut along a direction substantially perpendicular to the base board; and
    the first surface of the submount has an area that is substantially the same as an area of a bottom surface of the semiconductor light-emitting element that is connected to the first surface of the submount.

4. The semiconductor light-emitting device according to claim 1, wherein the submount has a stepped portion, and a part of the third surface of the submount located outside of the stepped portion is substantially perpendicular to the base board.

5. The semiconductor light-emitting device according to claim 4, wherein the first surface of the submount has a planar region where the semiconductor light-emitting element is located, the region having an area that is larger than an area of a bottom surface of the semiconductor light-emitting element that is connected to the first surface of the submount.

6. The semiconductor light-emitting device according to claim 4, wherein the first surface of the submount has a planar region where the semiconductor light-emitting element is located, the region having an area that is substantially the same as an area of a bottom surface of the semiconductor light-emitting element that is connected to the first surface of the submount.

7. The semiconductor light-emitting device according to claim 1, wherein the submount has a wedge-shaped cross section when cut along a direction substantially perpendicular to the base board, and the third surface of the submount is inwardly inclined from a middle portion towards both the first surface and the second surface of the submount.

8. The semiconductor light-emitting device according to claim 1, wherein the submount has a wedge-shaped cross section when cut along a direction substantially perpendicular to the base board, and a part of the third surface of the submount is inwardly inclined and another part of the third surface is substantially perpendicular to the base board.

9. The semiconductor light-emitting device according to claim 1, wherein:
    the submount includes a recess in the first surface, the recess including an inner bottom surface;
    the semiconductor light-emitting element is located adjacent the inner bottom surface within the recess of the submount.

10. The semiconductor light-emitting device according to claim 9, wherein the third surface has:
    a middle surface extending from the second surface upward, the middle surface inclined outward; and a perpendicular surface that is substantially perpendicular to the second surface, the perpendicular surface extending from an upper end of the submount to the middle surface.

11. The semiconductor light-emitting device according to claim 9, wherein the third surface has a stepped portion, and a part of the third surface located between the stepped portion and the second surface is substantially perpendicular to the base board.

12. The semiconductor light-emitting device according to claim 10, wherein the recess has a mortar shape.

13. The semiconductor light-emitting device according to claim 11, wherein the recess has a mortar shape.

14. The semiconductor light-emitting device according to claim 1, wherein the fixing member is an adhesive.

15. The semiconductor light-emitting device according to claim 1, wherein the semiconductor light-emitting element is connected to the base board via a bonding wire.

16. A method of manufacturing the semiconductor light-emitting device according to claim 1, comprising:
   attaching the submount to the base board with the fixing member; and
   preventing the fixing member from extending beyond an outer periphery of the submount when the semiconductor light-emitting device is viewed from a light emitting direction of the semiconductor light emitting device.

17. The semiconductor light-emitting device according to claim 1, wherein the base board and the semiconductor light-emitting element are connected to each other by a bonding wire, and the bonding wire is bonded to a position on the base board located a further distance from the semiconductor light-emitting element in a direction parallel with the second surface than a position of any portion of the third surface of the submount when viewed from a direction above the semiconductor light-emitting element when mounted to the submount.

18. A semiconductor light-emitting device comprising:
   a submount having a first surface, a second surface that is substantially parallel to the first surface, and a third surface connecting the first surface and the second surface;
   a semiconductor light-emitting element located adjacent the first surface of the submount;
   a base board on which the second surface of the submount is fixed via a fixing member; and
   a transparent seal resin configured to seal at least the semiconductor light-emitting element and the submount so that the transparent seal resin also covers at least a part of the third surface and a part of the base board, wherein
   the second surface of the submount that is fixed on the base board has an area defined by an outermost periphery of the second surface that is smaller than an area defined by an outermost periphery of a maximum cross section area of the submount cut along a plane substantially parallel to both the first surface and the second surface of the submount.

19. The semiconductor light-emitting device according to claim 18, wherein the fixing member does not exist beyond the submount when viewed from a direction above the semiconductor light-emitting element when mounted to the submount.

20. The semiconductor light-emitting device according to claim 18, wherein the submount has a stepped portion, and a part of the third surface of the submount located outside of the stepped portion is substantially perpendicular to the base board.

21. The semiconductor light-emitting device according to claim 20, wherein the first surface of the submount has a planar region where the semiconductor light-emitting element is located, the region having an area that is larger than an area of a bottom surface of the semiconductor light-emitting element that is connected to the first surface of the submount.

22. The semiconductor light-emitting device according to claim 18, wherein:
   the submount includes a recess in the first surface, the recess including an inner bottom surface;
   the semiconductor light-emitting element is located adjacent the inner bottom surface within the recess of the submount.

23. The semiconductor light-emitting device according to claim 22, wherein the third surface has a stepped portion, and a part of the third surface located between the stepped portion and the second surface is substantially perpendicular to the base board.

24. The semiconductor light-emitting device according to claim 18, wherein the fixing member is an adhesive.

25. The semiconductor light-emitting device according to claim 18, wherein the semiconductor light-emitting element is connected to the base board via a bonding wire.

* * * * *